United States Patent
Sumita et al.

(10) Patent No.: US 6,479,167 B2
(45) Date of Patent: Nov. 12, 2002

(54) SEALING MATERIAL FOR FLIP-CHIP SEMICONDUCTOR DEVICE, AND FLIP-CHIP SEMICONDUCTOR DEVICE MADE THEREWITH

(75) Inventors: Kazuaki Sumita; Toshio Shiobara, both of Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/774,581

(22) Filed: Feb. 1, 2001

(65) Prior Publication Data

US 2001/0034382 A1 Oct. 25, 2001

(30) Foreign Application Priority Data

Feb. 1, 2000 (JP) ........................................ 2000-023598
Feb. 1, 2000 (JP) ........................................ 2000-023599
Aug. 10, 2000 (JP) ........................................ 2000-242172

(51) Int. Cl.$^7$ ............................................... H01L 29/12
(52) U.S. Cl. ........................ 428/620; 257/789; 257/793; 257/795; 523/201; 523/205; 523/210; 523/211; 523/466
(58) Field of Search ................................ 523/466, 201, 523/205, 210, 211; 428/620; 257/789, 793, 795

(56) References Cited

U.S. PATENT DOCUMENTS

| | | | |
|---|---|---|---|
| 4,999,699 A | | 3/1991 | Christie et al. |
| 5,089,440 A | | 2/1992 | Christie et al. |
| 5,248,710 A | * | 9/1993 | Shiobara .................. 523/435 |
| 5,292,688 A | | 3/1994 | Hsiao et al. |
| 5,298,595 A | | 3/1994 | Reimann et al. |

OTHER PUBLICATIONS

Bruins, "Epoxy Resin Technology", Interscience Publishers, pp 9, 163, 1968.*

* cited by examiner

*Primary Examiner*—Robert Dawson
*Assistant Examiner*—D. Aylward
(74) *Attorney, Agent, or Firm*—Birch, Stewart, Kolasch & Birch, LLP (57) ABSTRACT

A sealing material for flip chip-type semiconductor devices comprises a liquid epoxy resin composition which includes (A) a liquid epoxy resin, (B) an optional curing agent, (C) an inorganic filler, and (D) 1 to 15 parts by weight of a microencapsulated catalyst per 100 parts by weight of components A and B combined. The excellent thin-film penetration and shelf stability of the sealing material confer a very high reliability to flip chip-type semiconductor devices made using the sealing material.

16 Claims, 1 Drawing Sheet

SEALING MATERIAL FOR FLIP-CHIP SEMICONDUCTOR DEVICE, AND FLIP-CHIP SEMICONDUCTOR DEVICE MADE THEREWITH

BACKGROUND OF THE INVENTION

1. Field of the Invention

The present invention relates to sealing materials (or sealants) for flip chip-type semiconductor devices, and more particularly to underfill materials. The invention also relates to flip chip-type semiconductor devices sealed with such sealants.

2. Prior Art

The trend toward smaller sizes, lighter weights and increased capabilities in electrical equipment has led to a shift in the dominant semiconductor mounting process from pin insertion to surface mounting. One bare chip mounting technique is flip chip (FC) mounting, which involves forming anywhere from several electrodes to several thousand electrodes called "bumps" about 10 to 100 $\mu$m in height on the interconnect pattern side of a large-scale integration (LSI) chip, and bonding the substrate electrodes with a suitable material such as a conductive paste or solder. The sealing materials (or sealants) used for flip chip protection must be introduced into small gaps only a few tens of microns in size between the substrate and the bumps and other features on the LSI chip. Prior-art liquid epoxy resin compositions used as underfill materials in flip chips are comprised of an epoxy resin, a curing agent and an inorganic filler. It is generally the practice today to include in such compositions a large amount of inorganic filler so as to give the sealant a linear expansion coefficient which agrees with those of the semiconductor chip, the substrate and the bumps, thereby increasing device reliability.

Yet, although stress properties are no longer a problem in flip chip underfill materials having high loadings of such fillers, the higher filler content has increased the viscosity of the composition. The increased viscosity dramatically lowers the speed at which the composition penetrates the gap between the chip and the substrate, greatly reducing production efficiency. A desire has thus been felt for some way of overcoming this problem.

SUMMARY OF THE INVENTION

It is therefore an object of the invention to provide a sealing material (or sealant) or, more precisely, an underfill material, for flip chip-type semiconductor devices which contains a large amount of inorganic filler, yet has a low viscosity, allowing it to penetrate into small gaps. Another object of the invention is to provide a flip chip-type semiconductor device sealed with such a sealing material (or sealant).

The inventor has found that the formulation of (A) a liquid epoxy resin, (B) an optional curing agent, (C) an inorganic filler, and (D) 1 to 15 parts by weight of a microencapsulated catalyst per 100 parts by weight of component A alone (if component B is not included) or components A and B combined (if component B is included) provides sealing materials (or sealants) which have an excellent stability at high temperatures. Such sealants, in spite of containing a large amount of inorganic filler, can be brought to a low viscosity by elevating the temperature of the semiconductor device and can thus be introduced into small gaps, making them effective as underfill materials, particularly in large-die flip chip-type semiconductor devices. These properties are especially manifest when the microencapsulated catalyst serving as component (D) contains an imidazole compound and/or an organophosphorus compound, has an average particle size of 0.5 to 15 $\mu$m, and has a catalyst dissolution from the microcapsules into o-cresol, as measured at 30° C. over a period of 15 minutes, which corresponds to at least 70% by weight of the total amount of catalyst in the microcapsules.

It thus became clear to us that liquid epoxy resin composition-type sealing materials for flip-chip semiconductor devices have excellent thin-film penetration properties and shelf stability, particularly as underfill materials, and are capable of endowing semiconductor devices in which they have been used with exceptionally high reliability.

Accordingly, the invention provides a sealing material for flip chip-type semiconductor devices, which sealing material comprises a liquid epoxy resin composition that includes:
(A) a liquid epoxy resin,
(B) an optional curing agent
(C) an inorganic filler, and
(D) a microencapsulated catalyst.
The amount of the microencapsulated catalyst is 1 to 15 parts by weight per 100 parts by weight of component A alone (if component B is not included) or components A and B combined (if component B is included).

Preferably, the microencapsulated catalyst contains an imidazole compound and/or an organophosphorus compound, has an average particle size of 0.5 to 15 $\mu$m, and has a catalyst dissolution from the microcapsules into o-cresol, as measured at 30° C. over a period of 15 minutes, which corresponds to at least 70% by weight of the total amount of catalyst in the microcapsules.

The invention additionally provides a flip chip-type semiconductor device sealed with such a sealing material.

BRIEF DESCRIPTION OF THE DRAWINGS

FIG. 2 illustrates the test piece used in the penetration test described in the specification.

DETAILED DESCRIPTION OF THE INVENTION

Component A in the liquid epoxy resin composition comprising the inventive sealing material for flip chip-type semiconductor devices is a liquid epoxy resin that is not subject to any particular limitations with respect to molecular structure or molecular weight so long as it has at least two epoxy groups per molecule. Illustrative examples include bisphenol-type epoxy resins such as bisphenol A epoxy resin and bisphenol F epoxy resin, novolac-type epoxy resins such as phenolic novolac epoxy resin and cresol novolac epoxy resin, triphenolalkane-type epoxy resins such as triphenolmethane epoxy resin and triphenolpropane epoxy resin, phenolaralkyl-type epoxy resins, biphenylaralkyl-type epoxy resins, stilbene-type epoxy resins, naphthalene-type epoxy resins, biphenyl-type epoxy resins and cyclopentadiene-type epoxy resins. These epoxy resins may be used singly or as mixtures of two or more thereof.

The liquid epoxy resin used in the liquid epoxy resin composition may be any which has at least two epoxy groups per molecule and is liquid at room temperature (e.g., 25° C.). Bisphenol-type epoxy resins such as bisphenol A epoxy resin or bisphenol F epoxy resin are especially preferred. Such epoxy resins may have added thereto epoxy resins of the following structures, provided such addition does not adversely affect penetrability of the sealing material.

The liquid epoxy resin has a total chlorine content of preferably not more than 1,500 ppm, and especially not more than 1,000 ppm. When chlorine is extracted from the epoxy resin with water at an epoxy resin concentration of 50% and a temperature of 100° C. over a period of 20 hours, the water-extracted chlorine content is preferably not more than 10 ppm. At a total chlorine content of more than 1,500 ppm or a water-extracted chlorine level of more than 10 ppm, the reliability of the sealed semiconductor device, particularly in the presence of moisture, may be compromised.

In the liquid epoxy resin composition of the invention, the liquid epoxy resin serving as component A can be cured by the microencapsulated catalyst serving as component D, obviating the need for a curing agent, in which case the composition is an epoxy self-condensing composition. However, if necessary, a curing agent may also be included to effect curing of the composition as, for example, a phenolic resin-curable, acid anhydride-curable or amine-curable composition.

Component B of the inventive sealant (sealing material) is a curing agent, use of which is optional. Any known curing agent may be employed without particular limitation with respect to characteristics such as molecular structure and molecular weight, provided the compound has at least two functional groups (e.g., phenolic hydroxyl groups, amino groups, acid anhydride groups) capable of reacting with the epoxy groups on the epoxy resin serving as component A, one or more of which functional groups is an acid anhydride group. For example, phenolic resins having at least two phenolic hydroxyl groups per molecule may be used for this purpose. Illustrative examples include novolac-type phenolic resins such as phenolic novolac resin and cresol novolac resin, xylylene-modified novolac resins such as p-xylylene-modified novolac resin, m-xylylene-modified novolac resin and o-xylylene-modified novolac resin, bisphenol-type phenolic resins such as bisphenol A resin and bisphenol F resin, biphenyl-type phenolic resins, resol-type phenolic resins, phenol aralkyl-type resins, biphenyl aralkyl-type resins, triphenolalkane-type resins such as triphenol-methane resin and triphenolpropane resin, and phenolic resins which are polymers of any of the above; as well as naphthalene ring-containing phenolic resins and dicyclopentadiene-modified phenolic resins. Compounds other than phenolic resins which are also suitable for use as the optional curing agent include amine-type curing agents and acid anhydride-type curing agents.

Acid anhydrides are especially advantageous as the curing agent in liquid epoxy resin compositions adapted for use as underfill materials in flip chip-type semiconductor devices. Preferred acid anhydrides include those having on the molecule one or two aliphatic or aromatic ring, one or two acid anhydride groups (e.g., —CO—O—CO—), and about 4 to 25 carbons, and especially about 8 to 20 carbon atoms. Such acid anhydrides are exemplified by tetrahydrophthalic anhydride, methyltetrahydrophthalic anhydride, methylhexahydrophthalic anhydride, hexahydrophthalic anhydride, methylhymic anhydride, pyromellitic dianhydride, 3,4-dimethyl-6-(2-methyl-1-propenyl)-4-cyclohexane-1,2-dicarboxylic acid, 1-methyl-4-(1-methylethyl)-bicyclo-[2.2.2]octo-5-en-2,3-dicarboxylic acid, maleinized alloocimene, benzophenonetetracarboxylic dianhydride, 3,3',4,4'-biphenyltetracarboxylic dianhydride, bis(3,4-dicarboxyphenyl)ether dianhydride, bis(3,4-dicarboxyphenyl)-methane dianhydride and 2,2-bis(3,4-dicarboxyphenyl)propane dianhydride.

Other curing agents that may be used in the liquid epoxy resin composition of the invention include also carboxylic acid hydrazides such as dicyandiamide, adipic acid hydrazide and isophthalic acid hydrazide.

As already noted, the curing agent serving as component B is an optional component and does not need to be included in the liquid epoxy resin composition when the composition is cured as a self-polymerizing (epoxy self-condensing) composition. However, in cases where a curing agent is used to cure the liquid epoxy resin composition, the curing agent should be included in an amount that is effective for curing the epoxy resin. If the curing agent is a phenolic resin, the molar ratio of phenolic hydroxyl groups in the curing agent per mole of epoxy groups on the epoxy resin is preferably from 0.5 to 1.5. Likewise, if the curing agent is an acid anhydride, the molar ratio of carboxyl groups derived from acid anhydride groups (—CO—O—CO—) in the curing agent per mole of epoxy groups on the epoxy resin is preferably from 0.5 to 1.5. At a molar ratio of less than 0.5, the curability may be inadequate. On the other hand, at a molar ratio greater than 1.5, unreacted acid anhydride may remain, possibly lowering the glass transition temperature. A molar ratio within a range of 0.8 to 1.2 is especially preferred. Alternatively, for substantially the same reasons, an acid anhydride curing agent may be incorporated such that the molar ratio of acid anhydride groups in the acid anhydride curing agent per mole of epoxy groups on the epoxy resin is in a range of preferably 0.3 to 0.7, and most preferably 0.4 to 0.6.

Component C of the inventive sealant (sealing material) is an inorganic filler. Any inorganic filler known to be useful for lowering the expansion coefficient may be employed. Specific examples include fused silica, crystalline silica, alumina, boron nitride, aluminum nitride, silicon nitride, magnesia and magnesium silicate. Of these, spherical fused silica is desirable for achieving low viscosity and high penetration. To obtain a sealant for underfilling which exhibits both improved penetration and a lower linear expansion, it is advantageous to include a filler having an average particle size at most about one-tenth as large and a maximum particle size at most one-half as large as the size of the gap between the substrate and chip in a flip chip semiconductor device. The amount of such filler included in the sealant is in a range of preferably 100 to 400 parts by weight, and especially 150 to 250 parts by weight, per 100 parts by weight of the epoxy resin and the curing agent combined. At less than 100 parts by weight, the expansion coefficient tends to be too large, which may cause cracks to form in a thermal shock test. On the other hand, at more than 400 parts by weight, the viscosity rises, which may bring about a decline in the thin-film penetration properties. The inorganic filler used in the sealant of the invention typically has a maximum particle size of preferably up to 50 μm, more preferably up to 45 μm, and most preferably up to 30 μm. The average particle size of the filler is generally up to 10 μm, preferably from 0.5 to 10 μm, more preferably from 1 to 5 μm, and most preferably from 1 to 3 μm. The maximum particle size and average particle size may be obtained by particle size distribution measurement involving laser diffraction analysis. The average particle size may be suitably determined as the weight average value, or median diameter.

In the practice of the invention, preliminary surface treatment of the inorganic filler with a coupling agent such as a silane coupling agent or a titanate coupling agent is advantageous for further improving the low moisture absorption, impact resistance and crack resistance of the cured sealant.

Illustrative examples of suitable coupling agents include epoxy functional group-bearing alkoxysilanes such as γ-glycidoxypropyltrimethoxysilane, γ-glycidoxypropyl-methyldiethoxysilane and β-(3,4-epoxycyclohexyl)ethyltrimethoxysilane; amino functional group-bearing alkoxysilanes such as N-β-(aminoethyl)-γ-aminopropyl-trimethoxysilane, γ-aminopropyltriethoxysilane and N-phenyl-γ-aminopropyltrimethoxysilane; and mercapto functional group-bearing alkoxysilanes such as γ-mercaptopropyl-trimethoxysilane. No particular limitation is imposed on the amount of coupling agent and method used in surface treatment.

Component D in the sealant (sealing material) of the invention is a microencapsulated catalyst. The catalyst serves as an epoxy resin curing accelerator for promoting the curing reaction. Typically, the microencapsulated catalyst contains an imidazole compound and/or an organophosphorus compound. The average particle size of the catalyst is preferably 0.5 to 15 μm, more preferably 1 to 10 μm, and most preferably 2 to 7 μm. Dissolution of the catalyst from the microcapsules into o-cresol, as measured at 30° C. over a period of 15 minutes, preferably corresponds to at least 70% by weight (i.e., from 70 to 100% by weight) of the total amount of catalyst in the microcapsules.

The catalyst microcapsules preferably contain as the curing catalyst an imidazole compound and/or an organophosphorus compound. Imidazole compounds that may be used include those of the following general formula (1)

In the formula (1), $R^1$ and $R^2$ are each independently a hydrogen atom or a substituted or unsubstituted monovalent hydrocarbon group of 1 to 12 carbons, and preferably 1 to 6 carbons, examples of which include alkyls, substituted alkyls and aryls such as methyl, ethyl, hydroxymethyl and phenyl. $R^3$ is a substituted or unsubstituted monovalent hydrocarbon group of 1 to 12 carbons, and preferably 1 to 6 carbons, examples of which include alkyls, alkenyls and aryls such as methyl, ethyl, phenyl and allyl. $R^4$ is a hydrogen atom; a substituted or unsubstituted monovalent hydrocarbon group of 1 to 12 carbons, and preferably 1 to 6 carbons, examples of which include alkyls, substituted alkyls and aralkyls such as methyl, ethyl, cyanoethyl and benzyl; or a group of formula (2) below.

(2)

The substituted monovalent hydrocarbon groups mentioned above include hydroxy-substituted and cyano-substituted monovalent hydrocarbon groups.

Specific examples of suitable imidazole compounds include 2-methylimidazole, 2-ethylimidazole, 2-undecylimidazole, 2,4-dimethylimidazole, 2-heptadecylimidazole, 1,2-dimethylimidazole, 1,2-diethylimidazole, 2-phenyl-4-methylimidazole, 2,4,5-triphenylimidazole, 2-ethyl-4-methylimidazole, 2-phenylimidazole, 1-benzyl-2-phenylimidazole, 1-cyanoethyl-2-methylimidazole, 1-cyanoethyl-2-undecylimidazole, 1-benzyl-2-methylimidazole, 2-phenyl-4,5-dihydroxymethylimidazole, 2-aryl-4,5-diphenylimidazoles, 2,4-diamino-6-[2'-methylimidazolyl-(1)']-ethyl-S-triazine, 2,4-diamino-6-[2'-ethyl-4'-methylimidazolyl-(1)']-ethyl-S-triazine, the isocyanuric acid addition product of 2,4-diamino-6-[2'-methylimidazolyl-(1)']-ethyl-S-triazine, and 2-phenyl-4-methyl-5-hydroxymethylimidazole. Of the above imidazole compounds, 2-phenyl-4-methyl-5-hydroxymethylimidazole, 2-phenyl-4,5-dihydroxymethylimidazole, 2,4-diamino-6-[2'-ethyl-4'-methylimidazolyl-(1)']-ethyl-S-triazine, 2-methylimidazole, 2-ethyl-4-methylimidazole, 2-ethylimidazole, 1,2-dimethylimidazole, 1,2-diethylimidazole, 2,4-dimethylimidazole and 2-phenyl-4-methylimidazole are preferred.

Organophosphorus compounds that may be used in the microencapsulated catalyst include organophosphine compounds, some examples of which are triorganophosphines such as triphenylphosphine, tributylphosphine, tri(p-methylphenyl)phosphine, tri(nonylphenyl)phosphine and diphenyltolylphoshine; salts of triorganophosphines and triorganoboranes, such as triphenylphosphine triphenylborane; and salts of tetraorganophosphonium and tetraorganoborate, such as tetraphenylphosphonium tetraphenylborate. Of these, organophosphine compounds of general formula (3) below are preferred.

(3)

In formula (3), $R^5$ is a hydrogen atom or an alkyl or alkoxy of 1 to 4 carbons.

Examples of suitable alkyl groups include methyl, ethyl, propyl, isopropyl, butyl, isobutyl and tert-butyl. Examples of suitable alkoxy groups include methoxy and ethoxy. $R^5$ is preferably a hydrogen atom or a methyl group.

Examples of formula (3) compounds include the following.

The microcapsules employed in the invention use as the shell material a polymer composed of (meth)acrylic monomers such as $C_{1-8}$ alkyl esters of acrylic acid, itaconic acid, methacrylic acid or crotonic acid, or $C_{1-8}$ alkyl esters of the same type in which the alkyl groups have substituents such as allyl groups; monofunctional olefinic (or vinyl) monomers such as styrene, α-methylstyrene, acrylonitrile, methacrylonitrile or vinyl acetate; and polyfunctional olefinic (or vinyl) monomers such as ethylene glycol di(meth)acrylate, polyethylene glycol di(meth)acrylate, divinylbenzene, bisphenol A di(meth)acrylate and methylenebis(meth) acrylamide. The imidazole compound and/or organophosphorus compound serving as the catalyst is enclosed within the polymer. Of the above polymers, a polymer of (meth) acrylic monomers is preferred.

Any of a variety of methods may be used to produce the above-described microcapsules containing an imidazole compound and/or organophosphorus compound as the curing catalyst, although the use of a method know to the art, such as suspension polymerization or emulsion polymerization, is advantageous for the efficient production of microcapsules of good sphericity.

To obtain what would normally be considered a high-concentration microencapsulated catalyst, based on the molecular structure of the catalyst, the above-described monomer is used in an overall amount of preferably about 10 to 200 parts by weight, more preferably 10 to 100 parts by weight, and most preferably 20 to 50 parts by weight, per 10 parts by weight of the curing catalyst. At less than 10 parts by weight, sufficient latency may be difficult to impart. On the other hand, the use of more than 200 parts by weight lowers the proportion of catalyst, which may make it necessary to use a large amount of microencapsulated catalyst to achieve sufficient curability and can therefore be economically undesirable. The curing catalyst (curing accelerator) is included within the microcapsules at a concentration of typically about 5 to 50% by weight (abbreviated as wt %, hereinafter), preferably about 9 to 50 wt %, and most preferably about 17 to 33 wt %.

The microcapsules produced by the foregoing process typically have an average particle size of 0.5 to 15 μm, preferably 1 to 10 μm, and most preferably 2 to 7 μm. The maximum particle size is preferably no greater than 50 μm, and most preferably no greater than 20 μm. At an average particle size of less than 0.5 μm, the microcapsules may be too small or the specific surface area of the microcapsules too large, the incorporation of a large amount of microcapsules in the sealant composition may increase the viscosity of the sealant, and the catalyst may have insufficient latency.

On the other hand, at an average particle size greater than 15 μm, dispersion in the resin component may become non-uniform, leading to a decline in the reliability, in addition to which the microcapsules may be so large as to cause gate obstruction during molding.

The microencapsulated catalyst used in the inventive sealant preferably has a performance such that, when 1 parts by weight (for example, 1 g) of the curing catalyst-containing microcapsules is measured out and mixed into 30 parts by weight (for example, 30 g) of o-cresol, the mixture is left to stand at 30° C. for 15 minutes, and the amount of catalyst that has dissolved out of the microcapsules is determined by gas chromatography, catalyst dissolution from the microcapsules into o-cresol corresponds to at least 70 wt % (i.e., 70 to 100 wt %) of the total amount of catalyst in the microcapsules. At less than 70 wt %, when the semiconductor device is molded using the epoxy resin composition, a molding time at 175° C. of at least 1 minute becomes necessary, which may lower the efficiency of production. A dissolution of at least 75 wt % (i.e., 75 to 100 wt %) of the catalyst from the microcapsules is preferred.

The microencapsulated catalyst is included within the sealant composition of the invention in an amount of from 1 to 15 parts by weight, and preferably 2 to 10 parts by weight, per 100 parts by weight of the epoxy resin (component A) when no curing agent (component B) is included, or per 100 parts by weight of components A and B combined when a curing agent is included. At less than 1 part by weight, the curability of the sealant composition declines to an unacceptable degree, whereas the use of more than 15 parts by weight provides an excellent curability, but an undesirable loss in shelf stability.

A curing catalyst that has not been microencapsulated may be optionally added as component E to the sealant composition of the invention. It is advantageous for the amount of component E to be such that the combined amount of microencapsulated catalyst and non-microencapsulated catalyst is from 1 to 15 parts by weight, and preferably from 2 to 7 parts by weight, per 100 parts by weight of the epoxy resin and curing agent combined. If the combined amount of catalyst is less than 1 part by weight, the curability tends to be inadequate, whereas an amount greater than 15 parts by weight provides excellent curability but the shelf stability of the sealant composition may suffer.

The non-microencapsulated curing catalyst, or curing accelerator, may be any known curing catalyst for epoxy resin compositions, including the aforementioned imidazole compounds and organophosphorus compounds, as well as tertiary amine compounds. Suitable tertiary amine compounds include amine compounds having alkyl or aralkyl substituents bonded to the nitrogen atom, such triethylamine, benzyl-dimethylamine, benzyltrimethylamine and α-methylbenzyl-dimethylamine; cycloamidine compounds or organic acid salts thereof, such as 1,8-diazabicyclo[5.4.0]undec-7-ene and its phenol, octanoic acid and oleic acid salts; and salts or complex salts of cycloamidine compounds with quaternary boron compounds, such as the compound of the following formula.

When both microencapsulated catalyst (component D) and non-microencapsulated curing catalyst (optional component E) are used in the inventive composition, the weight ratio E/D of non-microencapsulated curing catalyst to microencapsulated curing catalyst is preferably from 0 to 0.8, more preferably from 0 to 0.6, and most preferably from 0 to 0.4.

The sealant composition of the invention may include also a flexibilizer to lower stress. Suitable examples include silicone rubbers, silicone oils, liquid polybutadiene rubbers, and thermoplastic resins such as methyl methacrylate-butadiene-styrene copolymers. Preferably, the flexibilizer is a copolymer of an epoxy resin or phenolic resin with an organopolysiloxane, which copolymer has been prepared by the addition reaction of the alkenyl groups within an alkenyl group-bearing epoxy resin or phenolic resin with the SiH groups (that is, hydrogen atoms bonded to silicon atoms) in an organohydrogen-polysiloxane of formula (4) below having 20 to 400, and preferably 40 to 200, silicon atoms and having 1 to 5, preferably 2 to 4, and most preferably 2, SiH groups per molecule.

$$H_a R_b SiO_{(4-a-b)/2} \qquad (4)$$

1.95 to 2.05; and the sum a+b is a positive number from 1.81 to 2.3, and preferably from 1.96 to 2.06.

The monovalent hydrocarbon group serving as R preferably has 1 to 10 carbons, and especially 1 to 8 carbons. Illustrative examples include alkyl groups such as methyl, ethyl, propyl, isopropyl, butyl, isobutyl, tert-butyl, hexyl, cyclohexyl, octyl and decyl; alkenyl groups such as vinyl, allyl, propenyl, butenyl and hexenyl; aryl groups such as phenyl, xylyl and tolyl; aralkyl groups such as benzyl, phenylethyl and phenylpropyl; and halogenated monovalent hydrocarbon groups in which some or all of the hydrogen atoms on the hydrocarbon groups have been substituted with halogen atoms (e.g., chlorine, fluorine, bromine), such as chloromethyl, bromoethyl and trifluoropropyl.

Copolymers having one of the following structures are preferred.

In formula (4), R is a substituted or unsubstituted monovalent hydrocarbon group; the letter a is a positive number from 0.002 to 0.1, and preferably from 0.01 to 0.1; the letter b is a positive number from 1.8 to 2.2, and preferably from In the above formulas, R is as defined above, $R^{11}$ is a hydrogen atom or an alkyl of 1 to 4 carbons, and $R^{12}$ is —CH$_2$CH$_2$CH$_2$—, —OCH$_2$—CH(OH)—CH$_2$—O—CH$_2$CH$_2$CH$_2$— or —O—CH$_2$CH$_2$CH$_2$—. The letter n is an integer from 8 to 398, and preferably from 38 to 198. The letter p is an integer from 1 to 10, and the letter q is an integer from 1 to 10.

By including the above type of copolymer in the inventive composition such that the amount of diorganopolysiloxane units is 0 to 20 parts by weight, and preferably 1 to 15 parts by weight, per 100 parts by weight of the liquid epoxy resin and the curing agent combined, stress in the cured sealant can be further reduced.

If necessary, the liquid epoxy resin composition serving as the inventive sealant may contain also other additives, including carbon-functional silanes for improving adhesion, pigments such as carbon black, dyes, antioxidants and surface treatment agents (e.g., γ-glycidoxypropyltrimethoxysilane).

The sealant of the invention may be prepared by the simultaneous or discrete stirring, dissolution, mixture or dispersion of the epoxy resin, inorganic filler and microencapsulated catalyst, as well as optional constituents such as curing agent, non-microencapsulated curing catalyst and flexibilizer, while carrying out heat treatment if necessary. No particular limitation is imposed on the apparatus used for mixing, stirring, dispersing and otherwise processing the mixture of components. Examples of apparatuses suitable for this purpose include an orbiting mortar and pestle mixer, three-roll mill, ball mill or planetary mixer which is equipped with a heater. Use can also be made of suitable combinations of these apparatuses.

The liquid epoxy resin composition used as the inventive sealant for flip chip-type semiconductor devices has a viscosity at 25° C. of preferably not more than 10,000 poises, and most preferably not more than 1,000 poise.

Figure 1:
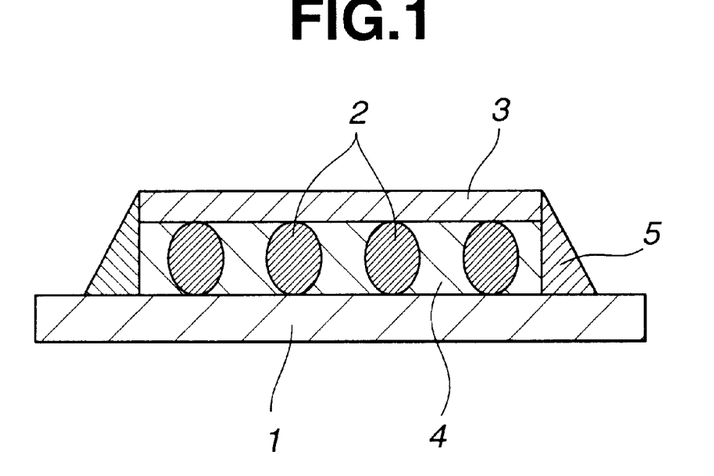
FIG. 1 is a schematic view of a flip chip-type semiconductor device according to one embodiment of the invention.

Referring to FIG. 1, the flip chip-type semiconductor device according to another aspect of the invention comprises an organic substrate 1 having an interconnect pattern side on which is mounted a semiconductor chip 3 over a plurality of intervening bumps 2. The gap between the organic substrate 1 and the semiconductor chip 3 (shown in the diagram as gaps between the bumps 2) is filled with an underfill material 4, and the lateral edges of the gap are sealed with a fillet material 5.

The inventive sealant may also be used as a fillet material, although it is particularly well suited to use as an underfill material.

An ordinary molding method and ordinary molding conditions may be employed when sealing flip chip-type semiconductor devices with the inventive sealant, although it is preferable to carry out an initial hot oven cure at about 100 to 120° C. for at least about 0.5 hour, followed by a subsequent hot oven cure at about 150° C. for at least about 0.5 hour. Initial curing conditions lower than the above-mentioned temperature and time may result in void formation after curing, and subsequent curing conditions lower than the temperature and time indicated above may yield a cured product having less than sufficient properties.

When the inventive sealant is used as an underfill material, the cured sealant preferably has an expansion coefficient at up to the glass transition temperature of from 20 to 40 ppm/°C. Sealant used as the fillet material may be a conventional material known to the art. The use of a liquid epoxy resin composition of the same general type as that described above is especially preferred, the only difference being that fillet sealant preferably contains from 250 to 500 parts by weight of an inorganic filler having an average particle size of 0.5 to 40 μm, and especially 1 to 20 μm, per 100 parts by weight of the combined amount of epoxy resin and curing agent. At less than 250 parts by weight, the expansion coefficient is large, which may cause fillet cracks to form in a thermal shock test. On the other hand, at more than 500 parts by weight, the viscosity increases, which may lower flowability of the compositions to such a degree as to make fillet formation impossible. Sealant for use as a fillet material preferably has an expansion coefficient, at a temperature below the glass transition temperature of the cured sealant, within a range of 10 to 20 ppm/°C.

EXAMPLES

Examples of the invention and comparative examples are given below by way of illustration, and are not intended to limit the invention.

Examples 1 to 4, and Comparative Examples 1 to 5

The components shown in Tables 1 and 2 were blended to uniformity on a three-roll mill to give nine epoxy resin compositions for use as underfill materials. The resulting epoxy resin compositions were used to carry out the following tests. The results are shown in Tables 1 and 2.

Viscosity

The viscosity at 25° C. was measured using a BH-type rotary viscometer at a rotational speed of 20 rpm.

Thixotropic Ratio

The thixotropic ratio was determined as the ratio between the viscosities measured at 25° C. with a BH-type rotary viscometer at rotational speeds of 2 rpm and 20 rpm.

Gelation Time

The gelation time for the composition was measured on a 150° C. hot plate.

Glass Transition Temperature (Tg)

Using a sample of cured material measuring 5×5×15 mm, the glass transition temperature was measured with a thermomechanical analyzer at a temperature rise rate of 5° C./min.

Coefficients of Thermal Expansion

In the measurement of the glass transition temperature described above, the coefficient of thermal expansion below the glass transition temperature (CTE-1) was determined for a temperature range of 50 to 80° C., and the coefficient of thermal expansion above the glass transition temperature (CTE-2) was determined for a temperature range of 200 to 230° C.

Penetration Test

Figure 2A:
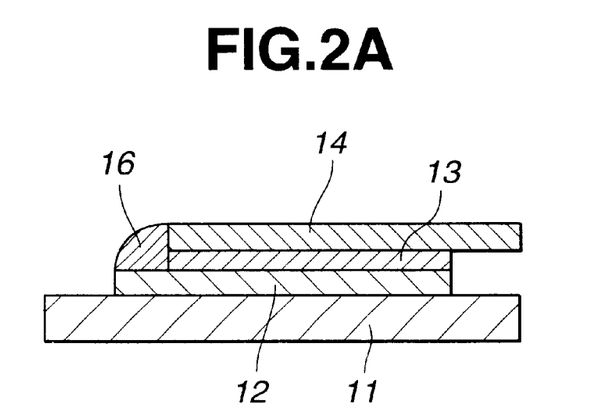
FIG. 2A is a side view of the test piece.
Figure 2B:
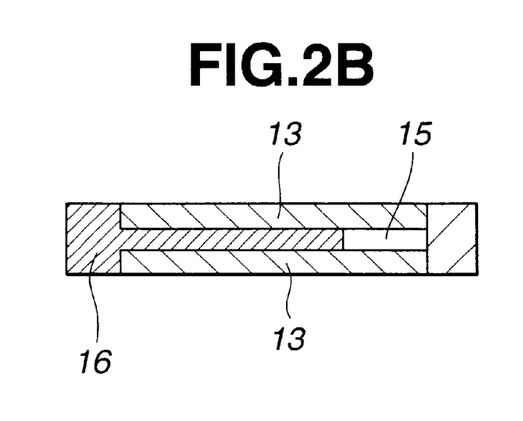
FIG. 2B is a plan view.

As shown in FIGS. 2A and 2B, a bottom glass slide 12 was placed on a hot plate 11, two strips of polyimide film 13 and 13, each having a thickness of 80 μm, were set on the bottom glass slide 12 at an interval therebetween of 1 cm, and a top glass slide 14 was placed over the polyimide film strips, thereby forming a gap 15 having a width of 1 cm and a height of 80 μm defined by the bottom and top glass slides 12 and 14 and the two strips of polyimide film 13 and 13. Next, an epoxy resin composition 16 was placed on the bottom glass slide 12, and the time it took for the composition 16 to penetrate a distance of 20 mm into the gap 15 was measured when the hot plate 11 was set at a temperature of 80° C. and a temperature of 120° C.

PCT Delamination Test

A polyimide-coated 10×10 mm silicon chip was stacked on a 30×30 mm FR-4 substrate using approximately 100 μm spacers. An epoxy resin composition-type underfill material was introduced into the resulting gap and cured. The assembly was then placed in a pressure cooker test (PCT) (121° C., 2.1 atm) environment, and the delamination after 168 hours was checked by C-SAM.

Thermal Shock Failure Rate

A polyimide-coated 0.6 mm thick silicon chip cut to dimensions of 10×10 mm was stacked on a 30×30 mm FR-4 substrate using approximately 100 μm spacers. An underfill material consisting of an epoxy resin composition was introduced into the resulting gap, and an epoxy resin composition-type fillet material was applied to the fillet areas, following which the compositions were cured at 150° C. for 4 hours. The resulting test specimens were subjected to thermal cycling between −55° C. for 1 minute and 160° C. for 30 seconds. Specimens in which cracks and delamination arose in the cured material after 50, 100 or 250 cycles were rejected, and the failure rate out of 20 specimens was measured in each case.

Shelf Stability Test

A sample of the composition was sealed in a plastic bottle held in a constant-temperature chamber at 25° C., and the change in viscosity after 96 hours of standing was measured.

Epoxy Resin Composition for Use as a Fillet Material

| | |
|---|---|
| RE310 | 30 parts by weight |
| RE304 | 17 parts by weight |
| MH700 | 45 parts by weight |
| SO32H | 250 parts by weight |
| KBM403 | 1.0 part by weight |
| HX3741 | 2 parts by weight |
| Copolymer containing diorganopolysiloxane units (formula appears below after Table 2) | 8 parts by weight |

Properties of Fillet Material

| | |
|---|---|
| Viscosity at 25° C. | 300 poise |
| Gelation time at 150° C. | 74 seconds |
| Tg | 130° C. |
| CTE-1 | 18 ppm/° C. |
| CTE-2 | 65 ppm/° C. |

TABLE 1

| Component (pbw) | Example 1 | Example 2 | Example 3 | Example 4 |
|---|---|---|---|---|
| RE304 | 100 | 100 | 100 | 100 |
| MH700 | | | | |
| SO32H | 150 | 150 | 150 | 150 |
| KBM403 | 1.0 | 1.0 | 1.0 | 1.0 |
| Copolymer | 2 | 2 | 2 | 2 |
| Microencapsulated catalyst (2E4MZ) | 10 | | | 5 |
| Microencapsulated catalyst(tri(p-methyl-phenyl)phosphine) | | 8 | 5 | |
| 2P4MHZ-PW | | | | 2 |
| 2E4MZ | | | | |
| Tri(p-methylphenyl) Phosphine | | | | |
| Viscosity at 25° C. (Pa · s) | 58.0 | 68.0 | 55.2 | 64.0 |
| Thixotropic ratio | 1.01 | 1.01 | 1.02 | 1.02 |
| Gelation time at 150° C. (s) | 88 | 90 | 85 | 90 |
| Tg (° C.) | 140 | 135 | 138 | 140 |
| CTE-1 (ppm/° C.) | 31 | 31 | 31 | 32 |
| CTE-2 (ppm/° C.) | 100 | 105 | 104 | 98 |
| Penetration test at 80° C. (s) | 280 | 260 | 280 | 240 |
| Penetration test at 120° C. (s) | 90 | 90 | 100 | 80 |
| PCT delamination test | No Delamination | no delamination | no delamination | no delamination |
| Thermal shock failure rate (%) | 0 | 0 | 10 | 0 |
| Shelf stability test | 3% increase in viscosity | 3% increase in viscosity | 5% increase in viscosity | 2% increase in viscosity |

TABLE 2

| Component (pbw) | Comp. Ex. 1 | Comp. Ex. 2 | Comp. Ex. 3 | Comp. Ex. 4 | Comp. Ex. 5 |
|---|---|---|---|---|---|
| RE304 | 100 | 50 | 50 | 100 | 100 |
| MH700 | | 50 | 50 | | |
| SO32H | 150 | 150 | 150 | 150 | 150 |
| KBM403 | 1.0 | 1.0 | 1.0 | 1.0 | 1.0 |
| Copolymer | 2 | 2 | 2 | 2 | 2 |
| Microencapsulated catalyst (2E4MZ) | 16 | | | | |

TABLE 2-continued

| Component (pbw) | Comp. Ex. 1 | Comp. Ex. 2 | Comp. Ex. 3 | Comp. Ex. 4 | Comp. Ex. 5 |
|---|---|---|---|---|---|
| Microencapsulated catalyst(tri(p-methylphenyl)phosphine) | | | | | |
| 2P4MHZ-PW | | | | | |
| 2E4MZ | | 0.5 | | 5 | |
| Tri(p-methylphenyl)phosphine | | | 0.3 | | 3 |
| Viscosity at 25° C. (Pa · s) | 73.5 | 25.0 | 32.0 | 48.5 | 66.4 |
| Thixotropic ratio | 1.8 | 1.02 | 1.03 | 1.03 | 1.03 |
| Gelation time at 150° C. (s) | 40 | 50 | 30 | 65 | 45 |
| Tg (° C.) | 135 | 140 | 142 | 142 | 135 |
| CTE-1 (ppm/° C.) | 33 | 28 | 30 | 30 | 32 |
| CTE-2 (ppm/° C.) | 108 | 110 | 110 | 100 | 101 |
| Penetration test at 80° C. (s) | did not reach 20 mm | did not reach 20 mm | 260 | 280 | did not reach 20 mm |
| Penetration test at 120° C. (s) | did not reach 20 mm | did not reach 20 mm | did not reach 20 mm | did not reach 20 mm | did not reach 20 mm |
| PCT delamination test | delamination occurred | delamination occurred | delamination occurred | no delamination | no delamination |
| Thermal shock failure rate (%) | 10 | 10 | 10 | 20 | 20 |
| Shelf stability test | 70% increase in viscosity | 50% increase in viscosity | 40% increase in viscosity | 30% increase in viscosity | 60% increase in viscosity |

Constituents

RE310: Bisphenol A-type epoxy resin (Nippon Kayaku Co., Ltd.)

RE304: Bisphenol F-type epoxy resin (Nippon Kayaku Co., Ltd.)

MH700: Methyltetrahydrophthalic anhydride (Shin-Nippon Rika Co., Ltd.)

SO32H: Spherical silica (Admatechs Co., Ltd.); maximum particle size, 45 μm; average particle size, 2 μm KBM403: The silane coupling agent γ-glycidoxypropyltrimethoxysilane (Shin-Etsu Chemical Co., Ltd.)

HX3741: Microencapsulated catalyst containing an imidazole compound (Asahi-CIBA Ltd.)

2E4MZ: 2-Ethyl-4-methylimidazole, which is liquid at room temperature (Shikoku Chemicals Corp.)

Microencapsulated catalyst (2E4MZ): A methyl methacrylate polymer which contains 20 wt % of 2E4MZ. Average particle size, 7 μm. Amount of catalyst which dissolves from microcapsules during 15 minutes of treatment in o-cresol at 30° C., 87 wt %.

Microencapsulated catalyst (tri(p-methylphenyl)phosphine): A copolymer of methyl methacrylate and styrene which contains 20 wt % of tri(p-methylphenyl)phosphine. Average particle size, 5 μm. Amount of catalyst which dissolves from microcapsules during 15 minutes of treatment in o-cresol at 30° C., 82 wt %.

2P4MHZ-PW: 2-Phenyl-4-methyl-5-hydroxymethylmidazole (Shikoku Chemical Corp.). A fine powder having an average particle size of 3.8 μm and a maximum particle size of 15 μm which is solid at room temperature.

Copolymer: An adduct of and

Examples 5 to 8, and Comparative Examples 6 to 8

The components shown in Table 3 were blended to uniformity on a three-roll mill to give seven epoxy resin compositions for use as underfill materials. The same tests as described above were carried out using these epoxy resin compositions. The results are shown in Table 3.

TABLE 3

| Component (pbw) | Example 5 | Example 6 | Example 7 | Example 8 | Comp. Ex. 6 | Comp. Ex. 7 | Comp. Ex. 8 |
|---|---|---|---|---|---|---|---|
| RE310 | 50 | — | 50 | 50 | 50 | 50 | — |
| RE304 | — | 50 | — | — | — | — | 50 |
| MH700 | 50 | 50 | 50 | 50 | 50 | 50 | 50 |
| SO32H | 150 | 150 | 150 | 150 | 150 | 150 | 150 |
| KBM403 | 1.0 | 1.0 | 1.0 | 1.0 | 1.0 | 1.0 | 1.0 |
| Microencapsulated catalyst (2E4MZ) | 3 | — | 3 | — | — | — | 0.5 |
| Microencapsulated catalyst (TPP) | — | 5 | 2 | 3 | — | — | — |
| 2E4MZ | — | — | — | — | 0.5 | — | 0.3 |
| TPP | — | — | — | — | — | 0.3 | — |
| Viscosity at 25° C. (Pa · s) | 380 | 250 | 330 | 200 | 450 | 530 | 410 |
| Thixotropic ratio | 1.01 | 1.01 | 1.05 | 1.05 | 1.06 | 1.03 | 1.02 |
| Gelation time at 150° C. (s) | 75 | 80 | 70 | 82 | 55 | 30 | 40 |
| Tg (° C.) | 143 | 138 | 145 | 140 | 145 | 135 | 125 |
| CTE-1 (ppm/° C.) | 30 | 30 | 31 | 30 | 31 | 30 | 30 |
| CTE-2 (ppm/° C.) | 107 | 108 | 110 | 108 | 110 | 108 | 115 |
| Penetration test at 80° C. (s) | 120 | 150 | 120 | 100 | did not reach 20 mm | did not reach 20 mm | 260 |
| Penetration test at 120° C. (s) | 80 | 90 | 80 | 70 | did not reach 20 mm | did not reach 20 mm | did not reach 20 mm |
| Shelf stability test | 3% increase in viscosity | 5% increase in viscosity | 5% increase in viscosity | 2% increase in viscosity | 50% increase in viscosity | 40% increase in viscosity | 1% increase in viscosity |

Constituents
RE310: Bisphenol A-type epoxy resin (Nippon Kayaku Co., Ltd.)
RE304: Bisphenol F-type epoxy resin (Nippon Kayaku Co., Ltd.)
MH700: Methyltetrahydrophthalic anhydride (Shin-Nippon Rika Co., Ltd.)
SO32H: Spherical silica (Admatechs Co., Ltd.); maximum particle size, 45 μm; average particle size, 2 μm
KBM403: The silane coupling agent γ-glycidoxypropyltrimethoxysilane (Shin-Etsu Chemical Co., Ltd.)
TPP: Triphenylphosphine (Hokko Chemical Industry Co., Ltd.)
2E4MZ: 2-Ethyl-4-methylimidazole, which is liquid at room temperature (Shikoku Chemicals Corp.)
Microencapsulated catalyst (2E4MZ): A methyl methacrylate polymer which contains 20 wt % of 2E4MZ. Average particle size, 7 μm. Amount of catalyst which dissolves from microcapsules during 15 minutes of treatment in o-cresol at 30° C., 87 wt %.
Microencapsulated catalyst (TPP): A copolymer of methyl methacrylate and styrene which contains 20 wt % of triphenylphosphine. Average particle size, 5 μm. Amount of catalyst which dissolves from microcapsules during 15 minutes of treatment in o-cresol at 30° C., 82 wt %.

Sealants for flip chip-type semiconductor devices according to the present invention have excellent thin-film penetration properties and shelf stability. These characteristics confer a very high reliability to flip chip-type semiconductor devices made using the inventive sealants.

Japanese Patent Application Nos. 2000-023598, 2000-023599 and 2000-0242172 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:
1. A sealing material for flip chip-type semiconductor devices, the sealing material comprising a liquid epoxy resin composition which includes:
  (A) a liquid epoxy resin,
  (C) an inorganic filler, and
  (D) 1 to 15 parts by weight of a microencapsulated catalyst per 100 parts by weight of component A,
  wherein the microencapsulated catalyst has a catalyst dissolution for the microcapsules into o-cresol, as measured at 30° C. over a period of 15 minutes, which corresponds to at least 70% by weight of the total amount of catalyst in the microcapsules.

2. A sealing material for flip chip-type semiconductor devices, the sealing material comprising a liquid epoxy resin composition which includes:
  (A) a liquid epoxy resin,
  (B) a curing agent
  (C) an inorganic filler, and
  (D) 1 to 15 parts by weight of a microencapsulated catalyst per 100 parts by weight of components A and B combined,
  wherein the microencapsulated catalyst has a catalyst dissolution for the microcapsules into o-cresol, as measured at 30° C. over a period of 15 minutes, which corresponds to at least 70% by weight of the total amount of catalyst in the microcapsules.

3. The sealing material according to claim 1 or 2, wherein the microencapsulated catalyst contains an imidazole compound or an organophosphorus compound or both, and has an average particle size of 0.5 to 15 μm.

4. The sealing material according to claim 3, wherein the microencapsulated catalyst contains an imidazole compound selected from the group consisting of 2-methylimidazole, 2-ethylimidazole, 1,2-dimethylimidazole, 1,2-diethylimidazole, 2-ethyl-4-methylimidazole, 2-phenyl-4-methylimidazole, 2,4-dimethylimidazole, 2,4-diamino-6-[2'-ethyl-4'-methylimidazolyl-(1)']-ethyl-S-triazine, 2-phenyl-4-methyl-5-hydroxymethylmidazole, and 2-phenyl-4,5-dihydroxymethylimidazole.

5. The sealing material of claim 1 or 2, which further includes (E) a curing catalyst that is not microencapsulated.

6. A flip chip-type semiconductor device which is sealed with the sealing material of claim 1 or 2.

7. The sealing material according to claim 3, wherein the microencapsulated catalyst contains 2-ethyl-4-methylimidazole.

8. The sealing material according to claim 1 or 2, wherein the microencapsulated catalyst contains tri(p-methylphenyl)phosphine.

9. The sealing material according to claim 3, wherein the microencapsulated catalyst has an average particle size of 2 to 7 µm.

10. The sealing material according to claim 1 or 2, wherein the microencapsulated catalyst has a catalyst dissolution for the microcapsules into o-cresol, as measured at 30° C. over a period of 15 minutes, which corresponds to at least 75% by weight of the total amount of catalyst in the microcapsules.

11. The sealing material according to claim 1 or 2, wherein the microencapsulated catalyst is encapsulated by a polymer made from (meth)acrylic monomers.

12. The sealing material according to claim 11, wherein the (meth)acrylic monomers being polymerized are employed in an amount of 20 to 50 parts by weight per 10 parts by weight of the catalyst being microencapsulated.

13. The sealing material according to claim 1, wherein the composition contains 2 to 7 parts by weight of the microencapsulated catalyst per 100 parts by weight of component A.

14. The sealing material according to claim 2, wherein the composition contains 2 to 7 parts by weight of the microencapsulated catalyst per 100 parts by weight of components A and B combined.

15. An underfill sealing material according to claim 1 or 2, having an expansion coefficient, at a temperature below the glass transition temperature of the cured sealant, with a range of 20 to 40 ppm/°C.

16. A sealing material for use as a fillet material according to claim 1 or 2, having an expansion coefficient, at a temperature below the glass transition temperature of the cured sealant, with a range of 10 to 20 ppm/°C.

* * * * *